(12) United States Patent
Tajima et al.

(10) Patent No.: US 6,373,911 B1
(45) Date of Patent: Apr. 16, 2002

(54) BIT SYNCHRONIZATION CIRCUIT

(75) Inventors: Akio Tajima; Yoshihiko Suemura; Soichiro Araki; Seigo Takahashi; Yoshiharu Maeno; Naoya Henmi, all of Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/239,090

(22) Filed: Jan. 27, 1999

(30) Foreign Application Priority Data

Jan. 28, 1998 (JP) ............................................ 10-014713

(51) Int. Cl.[7] ................................................ H03D 3/24
(52) U.S. Cl. ........................ 375/375; 327/152; 359/158
(58) Field of Search .............................. 375/354, 355, 375/357, 371, 373, 375, 376; 327/144, 152, 153, 147, 150, 149; 359/158, 159; 370/516, 517, 518, 519

(56) References Cited

U.S. PATENT DOCUMENTS

| | | | | |
|---|---|---|---|---|
| 5,574,756 A | * | 11/1996 | Jeong ........................... | 375/376 |
| 5,657,318 A | * | 8/1997 | Ohmori et al. ............. | 370/516 |
| 5,687,203 A | * | 11/1997 | Baba ........................... | 375/376 |
| 5,909,473 A | * | 6/1999 | Aoki et al. ................... | 375/373 |
| 5,920,600 A | * | 7/1999 | Yamaoka et al. ........... | 375/376 |
| 6,002,731 A | * | 12/1999 | Aoki et al. ................... | 375/371 |
| 6,064,707 A | * | 5/2000 | Woodman, Jr. ............. | 375/373 |
| 6,122,335 A | * | 9/2000 | Colella et al. ............... | 375/355 |
| 6,262,611 B1 | * | 7/2001 | Takeuchi ..................... | 327/159 |

FOREIGN PATENT DOCUMENTS

| | | |
|---|---|---|
| JP | 7-193562 | 7/1995 |
| JP | 8-125643 | 5/1996 |
| JP | 8-237117 | 9/1996 |
| JP | 9-162853 | 6/1997 |
| JP | 9-233061 | 9/1997 |
| JP | 10-303875 | 11/1998 |

* cited by examiner

*Primary Examiner*—Chi Pham
*Assistant Examiner*—Phuong Phu
(74) *Attorney, Agent, or Firm*—Ostrolenk, Faber, Gerb & Soffen, LLP

(57) ABSTRACT

A bit synchronization circuit operates at high speed range as high as Gb/s or higher and can establish synchronization within 10 bits with rejecting jitter to permit accurate bit synchronization. The bit synchronization circuit thus generates a plurality of clocks having mutually different phases in synchronism with an input reference clock. A phase relationship between a plurality of clocks and an input data to be decided is discriminated by a phase comparator circuit. The clock having optimal phase relationship, namely clock having level transition timing having at a substantially center portion of mutually adjacent level transition timing of the input data, is determined by a phase determination circuit. An decision circuit and selector are provided for deciding input data at the level transition timing of the determined clock.

9 Claims, 12 Drawing Sheets

BIT SYNCHRONIZATION CIRCUIT

BACKGROUND OF THE INVENTION

1. Field of the Invention

The present invention relates generally to a bit synchronization circuit. More specifically, the invention relates to a bit synchronization circuit for a optical receiver in a large scale optical interconnection network in a passive double star (PDS) system, a large scale computer, a large capacity Asynchronous Transfer Mode (ATM) switch.

2. Description of the Related Art

In a large capacity optical interconnection network employing an optical switch, signals from respective nodes are switched by the optical switch. Since distances between respective nodes are not equal to each other, bit synchronization has to be re-established in a receiver upon switching of the optical switch. A synchronization period is desired to be less than or equal to 10 bits so as not to lower throughput.

On the other hand, in order to enlarge the scale of network, high sensitivity of an optical receiver in each node is desired. Therefore, similarly to the conventional transmission system, assuming a transmission speed is A bit/s, a band of the optical receiver is set about 0.8×A Hz to eliminate unnecessary high-frequency noise to improve receiver sensitivity. On the other hand, a semiconductor optical amplifier gate is employed in the switching element, for influence of amplified spontaneous emission noise of the element, the optical receiver in each node is required a phase precision of an decision clock at about ±10% of one time slot.

Conventionally, as the bit synchronization method, there have been known a method using a Phase Locked Loop (PLL), a method using a timing tank, a method using a gated voltage controlled oscillator (gated VCO) and a method using a multi-phase clocks.

PLL is a method to control voltage of a voltage controlled oscillator (VCO) so as to eliminate a phase difference by phase comparison of a received signal and an output clock of VCO. The synchronization period depends on a response period of a loop and generally becomes micro-second order, about 10,000 bits at 10 Gb/s.

The timing tank is a method to establish bit synchronization by differentiating a received signal, rectify the differentiated output into all positive pulse (or negative pulse), and pass the output through a band pass filter (BPF). It has been known that assuming a Q factor of BPF is $Q_0$, the synchronization period becomes substantially $Q_0$ bits. In general, a Q factor is typically set to be greater than or equal to 100 in order to obtain clock with small jitter, the synchronization period becomes greater than or equal to 100 bits.

The method with gated VCO is an open loop method using rising and falling signal of the received data, which permits synchronization at 1 bit but has no jitter rejection effect.

On the other hand, in the bit synchronization circuit employing the multi-phase clocks, establishment of synchronization at several bits and rejection of jitter become possible. For example, in Japanese Unexamined Patent Publication No. Heisei 7-193562, the bit synchronization circuit includes a clock multi-phase clock generator outputting a plurality of N phase clock signals from a reference clock, a clock selection circuit inputting a received data and multi-phase clock output from the multi-phase clock generator to select the clock for decision, and an elastic storage reading out the received data with taking the clock output from the clock selection circuit as writing reference clock. By deciding received data using the selected clock by the clock selection circuit, bit synchronization is established.

In the conventional bit synchronization circuit selected an optimal phase from the multi-phase clocks, the clock of the optimal phase is selected in a logic circuit which takes the received data and a plurality of phases of clocks to decide the received data using the selected clock. At least several tens ps of delay is present per one gate of the circuit, a difference of hundred ps or more should be present in a phase relationship of data input to the clock selection circuit and the clock and in phase relationship of data input to an identifier and the clock.

However, since in a high speed range where a transmission speed of data is higher than or equal to several Gb/s, a period per one time slot becomes several hundreds ps, if difference in the phase relationship between the data input to the clock selection circuit and the clock and the phase relationship between the data input to the identifier and the clock become greater than or equal to 100 ps, decision phase of the identifier cannot be correct.

In case of a construction to compensate the phase difference by a gate delay, since fluctuation of the gate delay is at least ±20%, ±20 ps or more fluctuation is inherently caused. In case of 10 Gb/s, fluctuation of phase in the extent of ±20 ps results in degradation of receiver sensitivity more than or equal to 4 dB to make it difficult to put into practical use. On the other hand, in order to realize high speed operation higher than or equal to several Gb/s, operation speed of the circuit is close to extreme to be inoperative for too small amplitude unless a load capacity is made as small as possible. For this reason, a complicate logic circuit cannot be constructed because fan out number of the gate cannot be set large, wiring line of the signal line cannot be set long, the gate delay becomes about one half of one time slot and so forth.

Furthermore, unless the elastic storage is present, the phase of the data to be output can be differentiated depending upon the clock phase to cause dropout in the later stage to possibly cause malfunction. However, elastic storage operated at high speed as high as several Gb/s or higher is difficult to realize.

SUMMARY OF THE INVENTION

An object of the present invention is to provide a bit synchronization circuit which can operate within a high speed region as high as one Gb/s or higher without causing degradation of sensitivity due to phase deviation, with constant in phase of data to be output and can establish synchronization within 10 bit and has jitter rejection effect.

According to one aspect of the present invention, a bit synchronization circuit comprises:

multi-phase clock generating means for generating mutually different phases of plurality of clocks in synchronism with input reference clock;

a plurality of decision means for respectively deciding input data using different phases output from the multi-phase clock generating means as data decision clock;

phase comparator means for performing phase comparison between the input data and respective clocks of different phases output from the multi-phase clock generating means;

phase determining means for determining the clock occurring level transition timing at substantially center portion of mutually adjacent level transition timings of the input data depending upon a plurality of phase comparison outputs of the phase comparator means; and selection means for selecting and outputting an output of the decision means taking the clock determined by the phase determining means as the data decision clock, phase of the input data to the phase comparator means and the decision means being the same and phases of the clocks to the phase comparator means and the decision means being the same.

The bit synchronization circuit may further comprise holding means responsive to an external command signal for holding a result of determination of the phase determining means, and the selection means is controlled according to a holding output of the holding means.

Also, the bit synchronization circuit may further comprises delay means for making respective output timings from the decision means equal to each other.

In the preferred construction, each of the decision means may be a D-type flip-flop taking the input data as data input and the clock as clock input. Also, the phase comparator means may be a plurality of D-type flip-flops taking the clocks as respective data inputs and the input data as clock inputs.

The phase determining means may perform predetermined logical operation of a plurality of phase comparison outputs of the phase comparator means to determine the clock depending upon result of the logical operation.

Furthermore, the phase comparator means and the decision means are preferably arranged symmetrically with respect to an output portion of the multi-phase clock generating means and a data input portion.

In the preferred application, the bit synchronization circuit may be used in an optical receiver in an optical interconnection network employing an optical switch.

The external command signal may be a frame signal generated from a switching control portion of the optical switch.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

Figure 1:
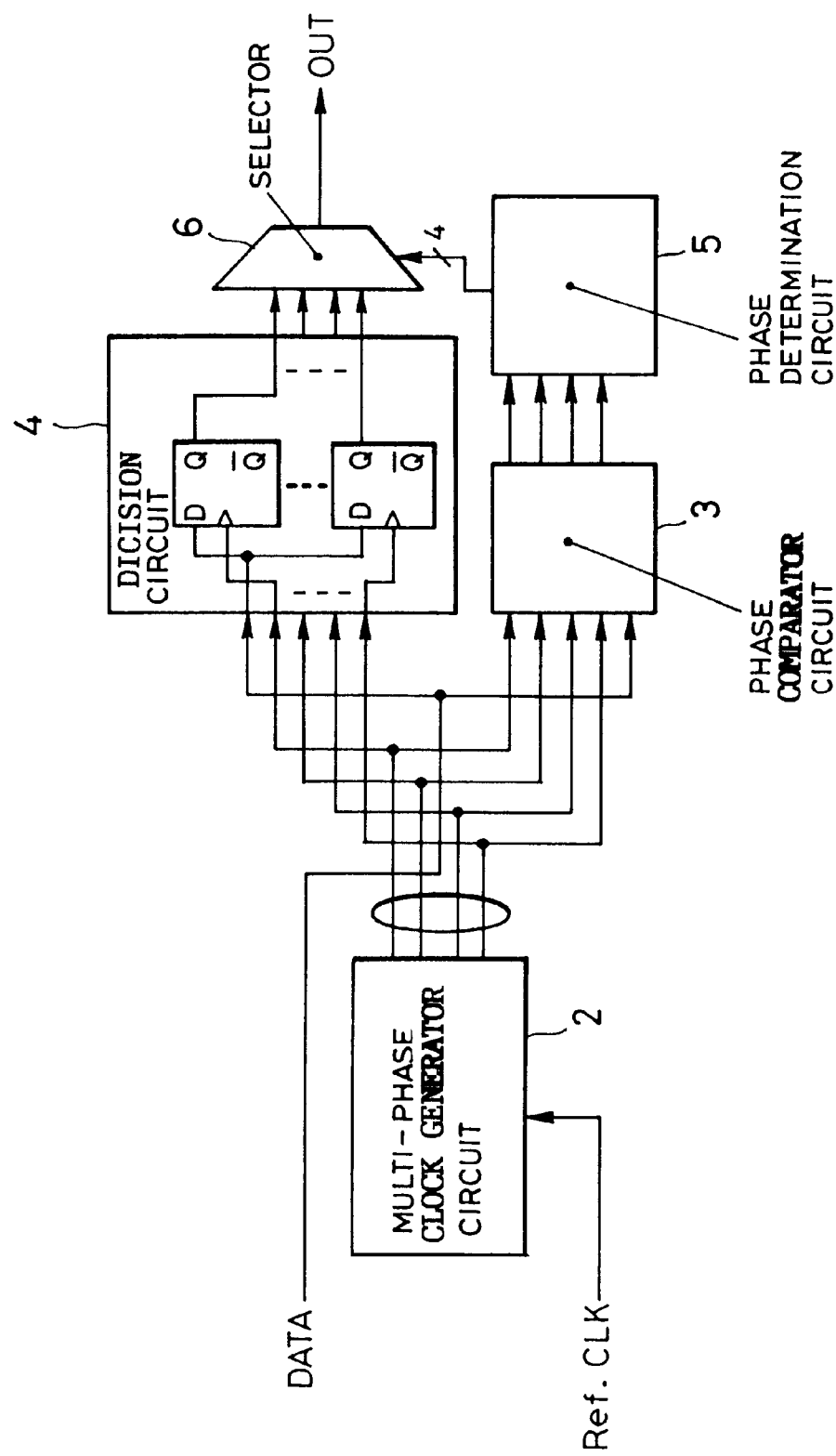
FIG. 1 is a block diagram of the first embodiment of a bit synchronization circuit according to the present invention.

FIG. 1 is a block diagram showing the first embodiment of a bit synchronization circuit according to the present invention. In the shown embodiment, number of clock phases is four and a data transmission speed is 10 Gb/s. The shown embodiment of the bit synchronization circuit is constructed with a multi-phase clock generator circuit 2, a phase comparison circuit 3, an decision circuit 4, a phase determination circuit 5 and a data selection circuit 6.

Figure 2:
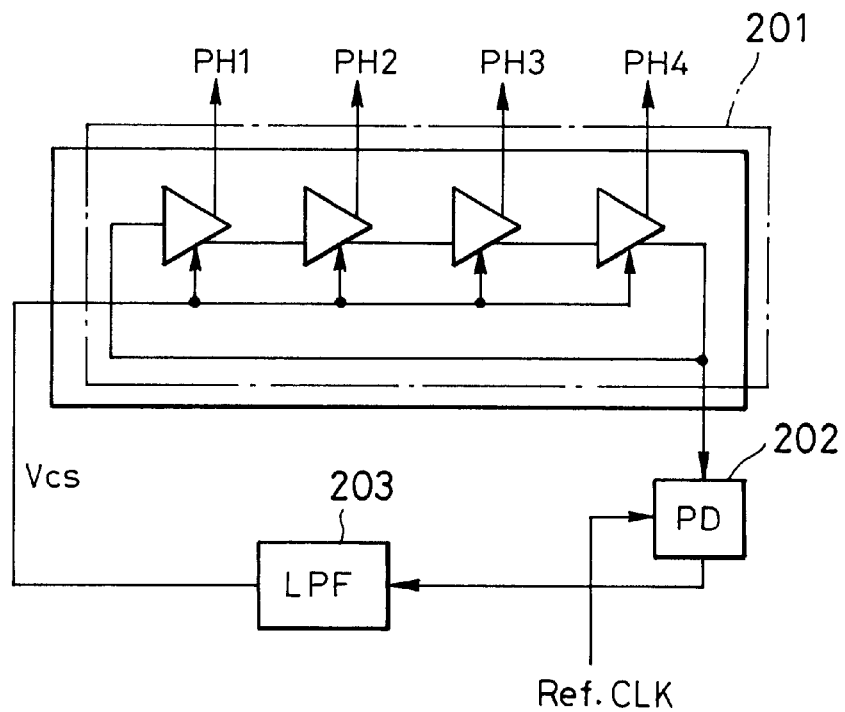
FIG. 2 is a block diagram showing a construction of a multi-phase clock generator circuit.

As shown in FIG. 2, the multi-phase clock generator circuit 2 is constructed with a ring oscillator 201, a phase detector 202 and a low-pass filter 203. With this construction, the multi-phase clock generator circuit 2 has a PLL circuit construction for outputting four phase clocks PH1 to PH4 synchronized with an input 10 GHz reference clock and having a phase deviation of 90 degree.

Figure 3:
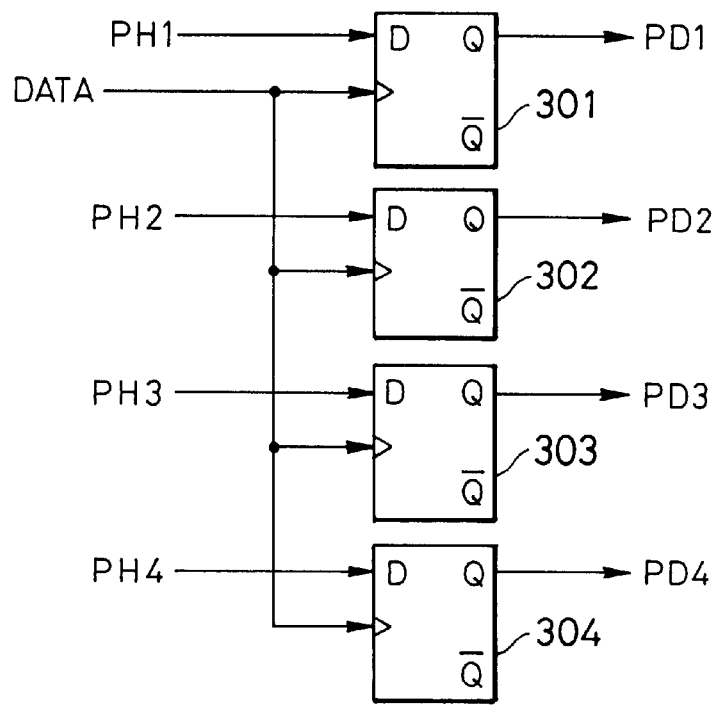
FIG. 3 is a block diagram showing a construction of a phase comparison circuit.

In the phase comparison circuit 3, as shown in FIG. 3, the four phase clocks PH1 to PH4 as output of the multi-phase clock generator circuit 2 to respective data inputs of D-type flip-flops (F/F) 301 to 304 for supplying input data to the clock input. With this construction, phase comparator of respective clocks PH1 to PH4 and the input data is performed to output phase comparison results PD1 to PD4.

Figure 4:
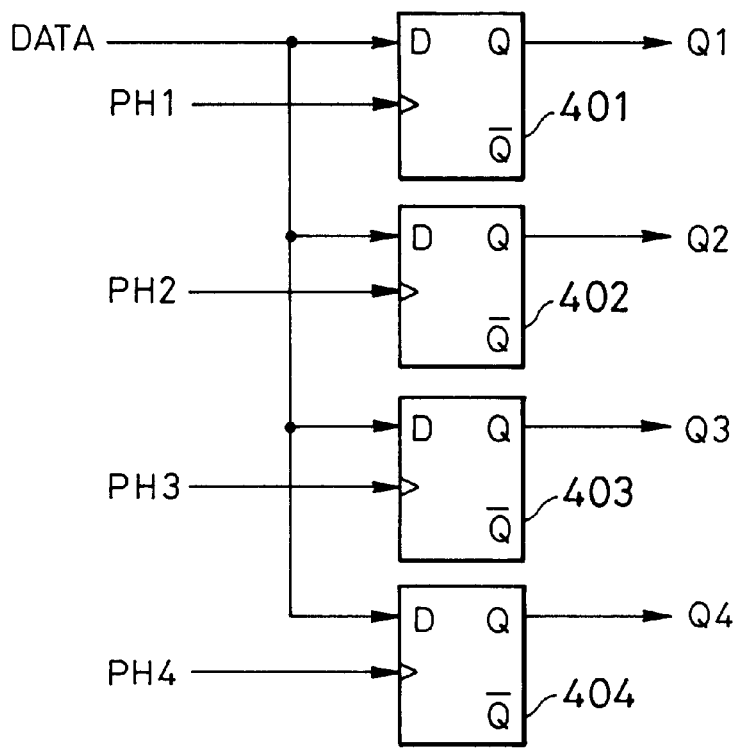
FIG. 4 is a block diagram showing a construction of an decision circuit.

As shown in FIG. 4, in the decision circuit 4, input data is supplied to data inputs of D-type flip-flop (F/F) 401 to 404 and clocks PH1 to PH4 of four kinds of phases as output of respective clock generator circuit 2 are input to the clock input. By these four phase clocks PH1 to PH4, input data is decided to output decided data to Q1 to Q4, respectively. Since a phase margin of the D-type F/F used herein is 180 degrees, input data can be accurately identified by any one of four phase clocks.

Figure 5:
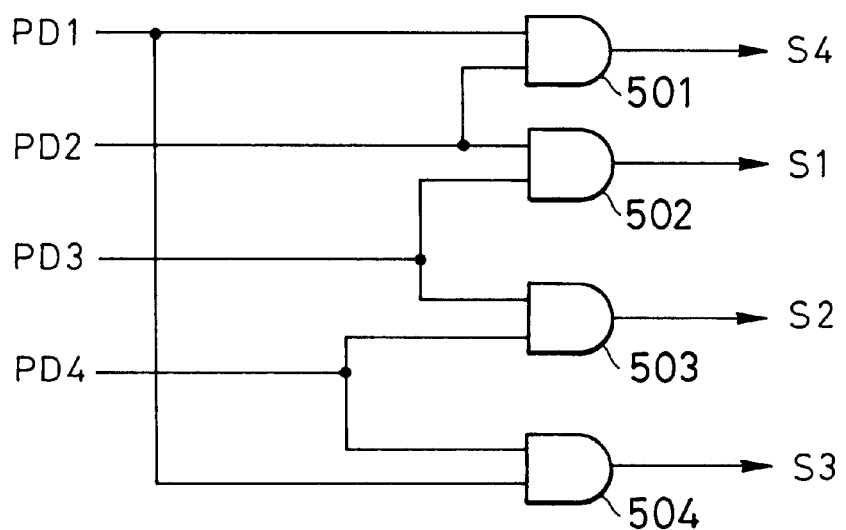
FIG. 5 is a block diagram showing a construction of a phase determination circuit.
Figure 6:
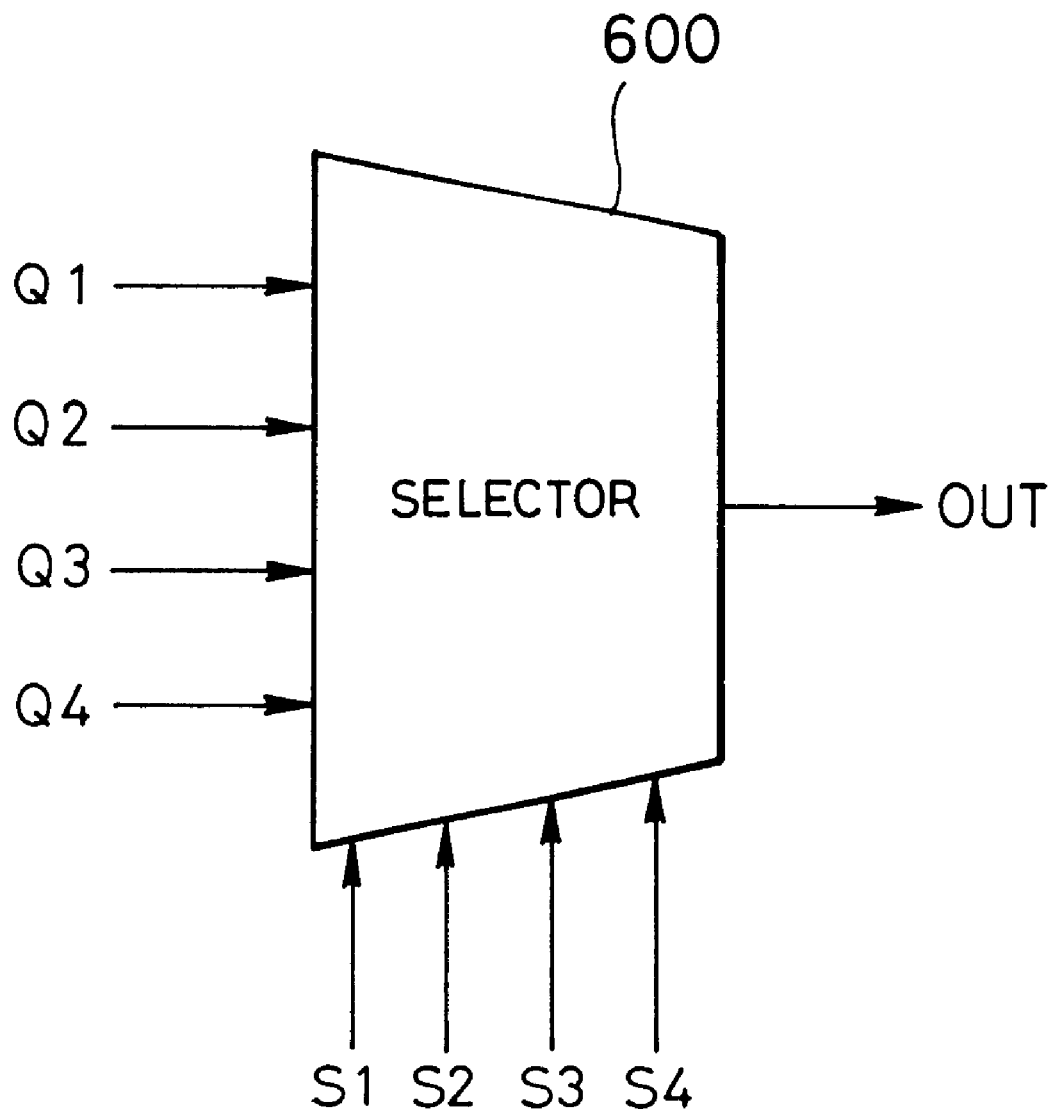
FIG. 6 is a block diagram showing a construction of a data selector circuit.

As shown in FIG. 5, the phase determination circuit 5 is constructed with AND gates 501 to 504 for outputting selection signals S1 to S4 on the basis of the outputs PD1 to PD4 of the phase comparator circuit 3. In the shown example, logical operation (AND logic) of mutually adjacent outputs of phase comparison outputs PD1 to PD4 (for example, PD1 and PD2, PD2 and PD3 and so on) is performed to obtain respective outputs S1 to S4. As shown in FIG. 6, the data selection circuit 6 selects and outputs one of the decision data Q1 to Q4 from the decision circuit 4 by the selection signals S1 to S4.

Since the phase comparator circuit 3 and the decision circuit 4 are constructed with the same element, upon being constructed in a chip, both circuits 3 and 4 are arranged symmetrically with respect to the output portion of the multi-phase clock generator circuit 2 and the data input portion, as shown in FIG. 1. Thus, supply lines of data to be input to both of these element becomes equal length wiring. Therefore, phases of the inputs for these two phase comparator circuit 3 and the decision circuit 4 becomes equal to each other. As well as data, supply lines of multi-phase clocks to be input to the phase comparator circuit 3 and the decision circuit 4 also becomes equal length wiring to make the phase of the input clocks the same.

Figure 7:
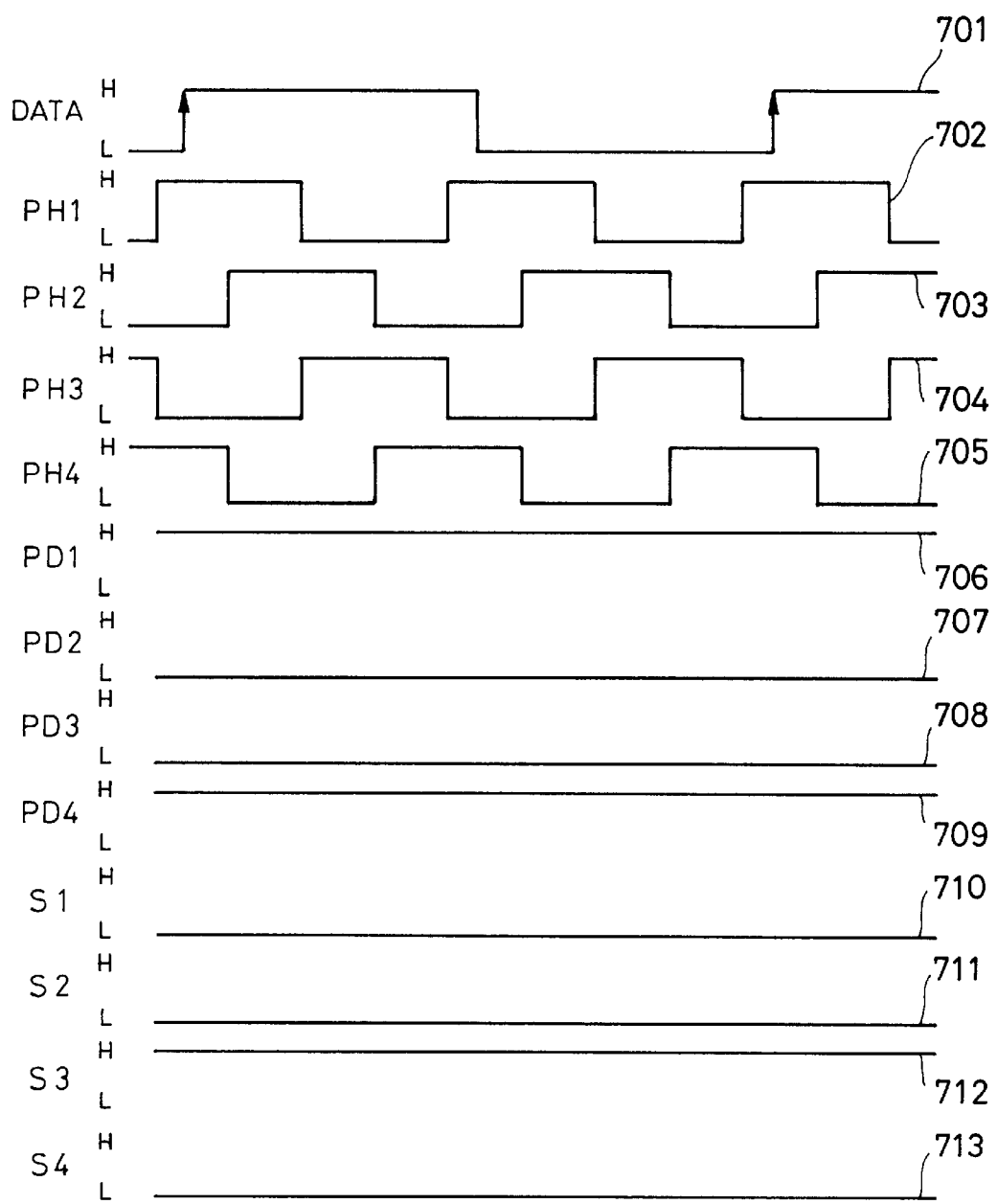
FIG. 7 is a timing chart showing operation of the bit synchronization circuit according to the present invention.

Next, operation will be discussed with reference to FIG. 7 showing timing chart. In FIG. 7, waveform, the reference numeral 701 denotes an input data, and 702 to 705 denotes respective clocks PH1 to PH4. In the timing of FIG. 7, an optimal clock phase for decision the input data is the clock PH3 which rises at substantially center portion of the time slot of the input data (namely at substantially center portion of mutually adjacent level transition timings of the input data).

The outputs PD1 to PD4 of the phase comparator circuit 3 resulting from phase comparison of the input data and PH1 to PH4 becomes H, L, L, H respectively as identified by 706 to 709. Then, the outputs S1 to S4 of the phase determination circuit 5 becomes L, L, H, L, respectively, as identified by 710 to 713. When respective L, L, H, L are input to S1 to S4 inputs of the data selection circuit 6, the data selection circuit 6 selects Q3. Since Q3 is the data decided by the optimal phase clock PH3, with this configuration, the input data is decided and output with an optimal phase.

On the other hand, a period up to establishment of bit synchronization is only delay for several gates and can be realized at several bits. While the case where the optimal clock phase decision data is PH3, has been disclosed in the shown example, the optimal phase among PH1 to PH4 is selected irrespective of the phase of the input data, and can decide and regenerate the input data for outputting. Therefore, decision and regenerator can be performed with stable clock. Thus, it is clear that jitter rejection effect can be achieved.

On the other hand, since phases of data and clock input to the phase comparator circuit 3 and the decision circuit 4 become equal, degradation of receiver sensitivity due to phase deviation of data or phase deviation of clock input to both circuits 3 and 4 will never be caused.

Figure 8:
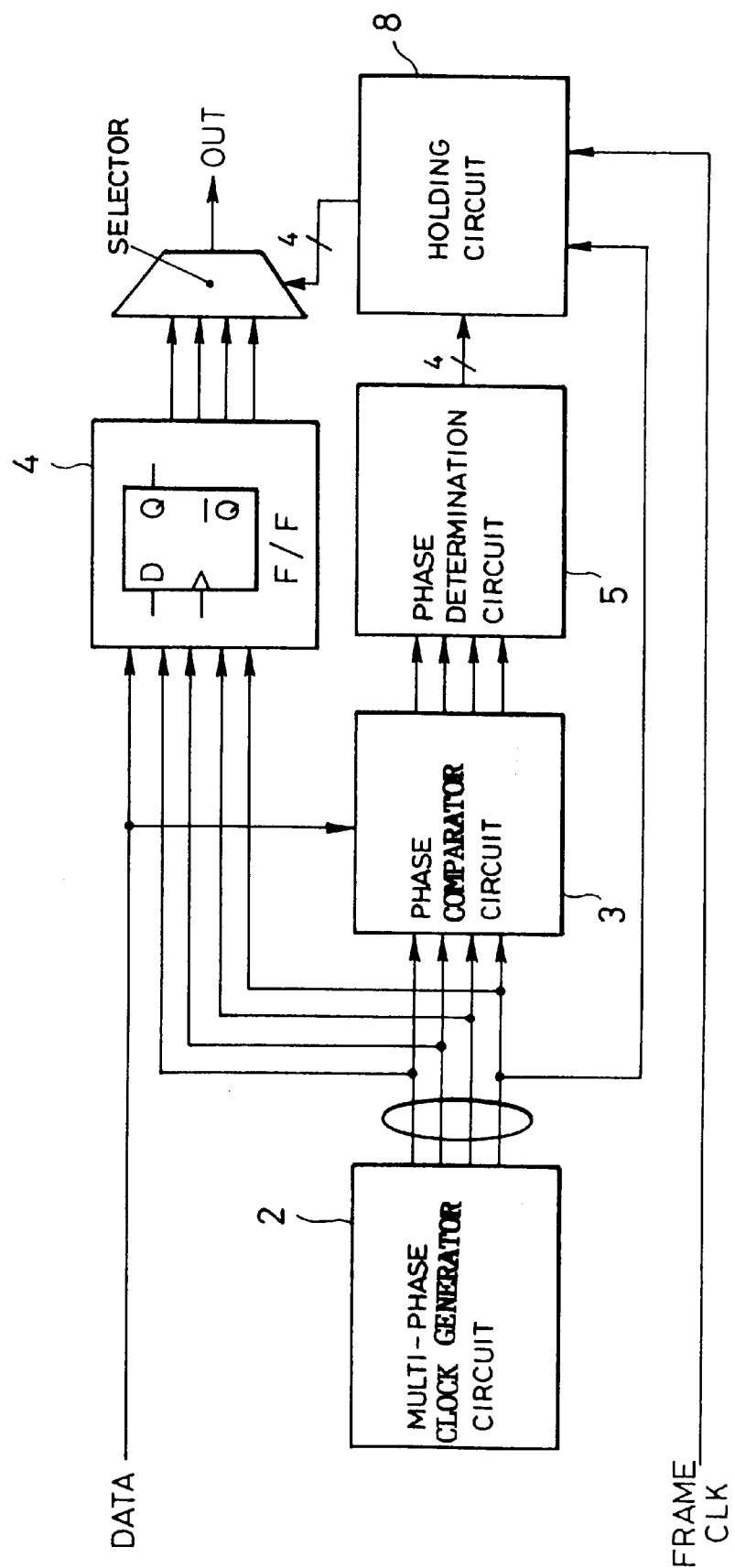
FIG. 8 a block diagram of the second embodiment of a bit synchronization circuit according to the present invention.

Next, the second embodiment of the bit synchronization circuit according to the invention will be discussed with reference to FIGS. 8 to 11. FIG. 8 is a block diagram of the second embodiment of the bit synchronization circuit. It should be noted that like elements to those of FIG. 1 will be decided by like reference numerals to neglect redundant disclosure for keeping the disclosure simple enough to facilitate clear understanding of the present invention. In the shown embodiment, number of clock phases is 4 and the data transmission speed is 10 Gb/s. The shown embodiment of the bit synchronization circuit is constructed with the multiphase clock generator circuit 2, the phase comparator circuit 3, the decision circuit 4, the phase determination circuit 5, the data selection circuit 6 and a holding circuit 8.

Figure 10:
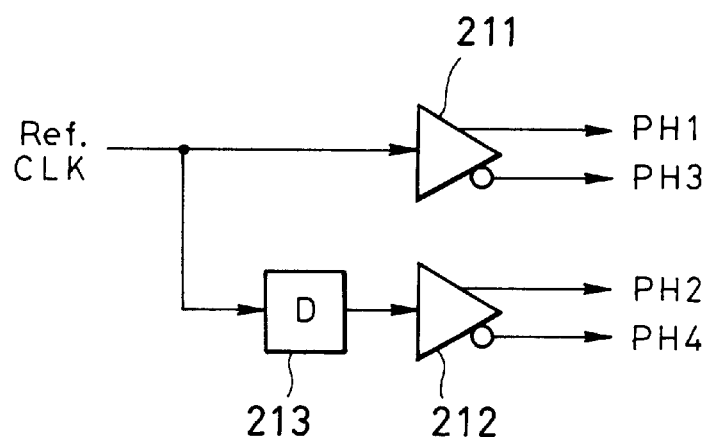
FIG. 10 is a block diagram showing a construction of a multi-phase clock generator circuit.

As shown in FIG. 10, the multi-phase clock generator circuit 2 is constructed with buffers 211 and 212 and a delay circuit 213 with a delay period of 25 ps (corresponding to 90 degree at 10 GHz) for outputting the four phase clocks PH1 to PH4 respectively shifted the phase at 90 degree.

Figure 9:
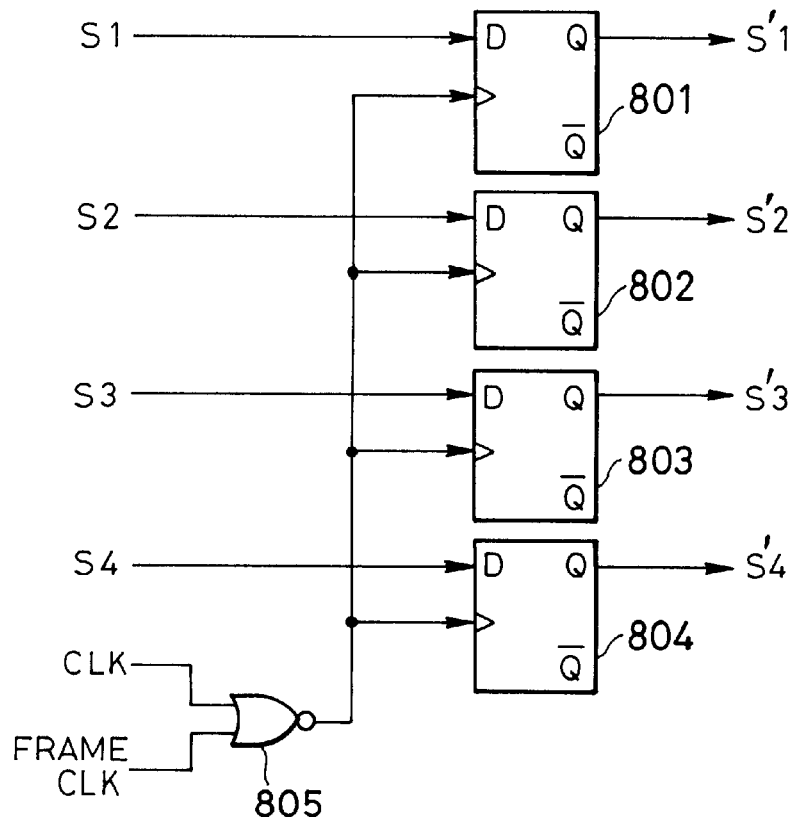
FIG. 9 is a block diagram showing a construction of a holding circuit.

The phase comparator circuit 3, the decision circuit 4, the phase determination circuit 5 and the data selection circuit 6 have the same construction as the first embodiment of FIG. 1. As shown in FIG. 9, the holding circuit 8 is constructed with D-type F/Fs 801 to 804 and a NOR circuit 805. The NOR circuit 805 takes one of the multi-phase clock (clock PH4 in the shown embodiment) and an external frame clock as inputs. The output of the NOR circuit 805 is respective clock inputs of respective D-type F/Fs 801 to 804. By this, while the frame clock is high (H), the output values S1 to S4 of the phase determination circuit 5 taken at the level transition timing to H, are held.

The frame clock will be discussed briefly. In case of optical receiver to be used in the bit synchronization circuit in an optical interconnection network employing the optical switch, the frame clock is generated from the switching control portion of the optical switch. When the frame clock becomes H, the effective input data is supplied to the receiver by switching of the optical switch. Therefore, while the frame clock is held L, phase comparator determination process for phase determination is performed by the phase comparator circuit 3 and the phase determination circuit 4. When the frame clock becomes H, the result of phase determination is taken and held by the holding circuit 8.

Namely, while the frame clock is held L, phase is selected, and while the frame clock is H, namely during reception of one frame of the input data, the phase of the frame clock are introduced with fixing as output phases S1' to S4' for clock determination.

Figure 11:
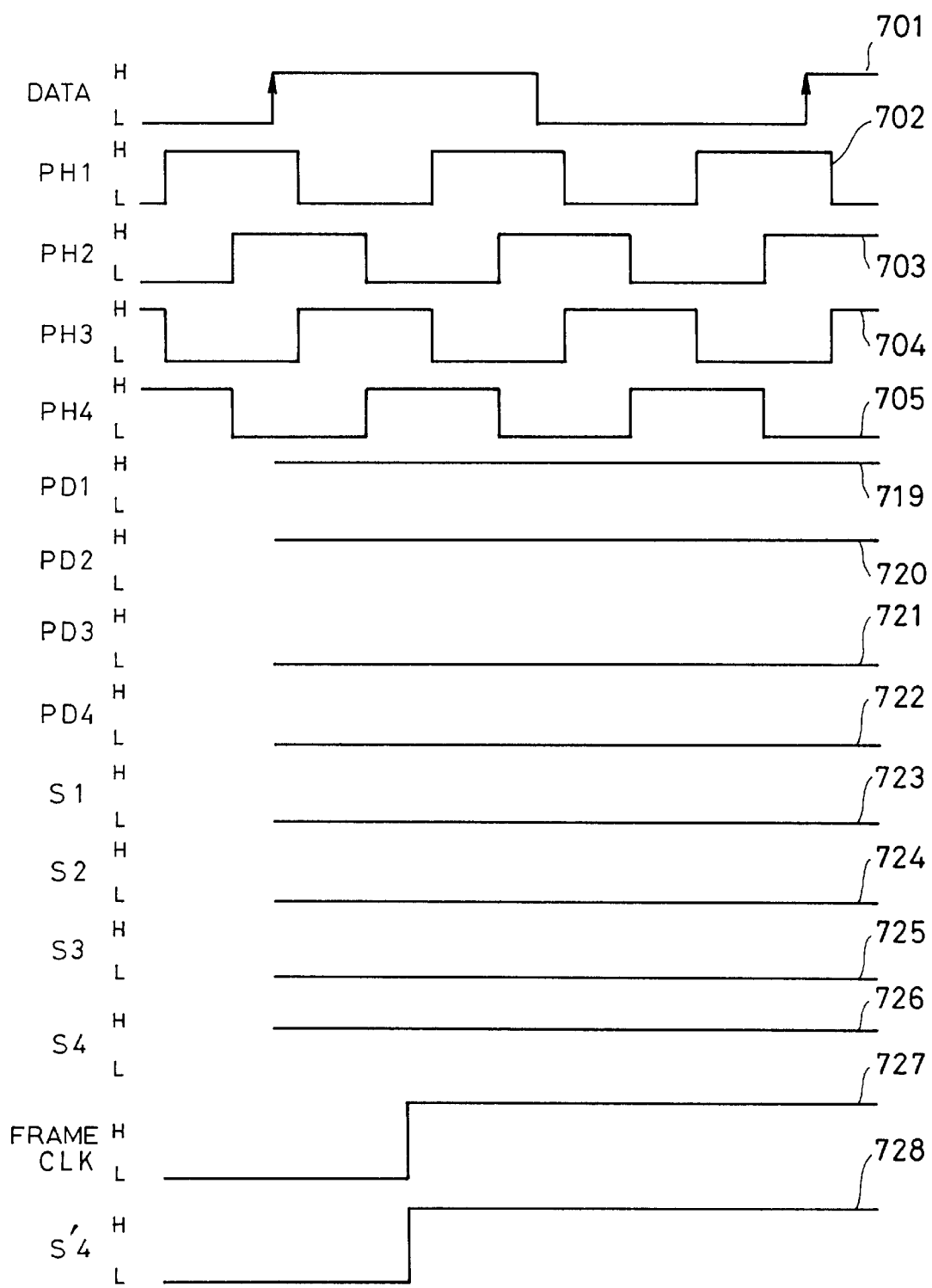
FIG. 11 is a timing chart showing operation of the bit synchronization circuit according to the present invention.

Next, discussion will be given for operation of the foregoing second embodiment of the bit synchronization circuit with reference to the timing chart shown in FIG. 11. Similarly to the first embodiment, the waveform 701 represents the input data, 702 to 705 represent respective clocks PH1 to PH4. At this timing of FIG. 10, the optimal clock phase for decision data is the clock PH4 rising at substantially center portion of the data time slot. The outputs PD1 to PD4 of the phase comparator circuit 3 resulting from respective phase comparator of data and PH1 to PH4 become H, H, L, L as respectively shown by 719 to 722. Then, the outputs S1 to S4 of the phase determination circuit 5 become L, L, L, H respectively as shown by 723 to 726.

When S1 to S4 are input to the holding circuit 8, while the frame clock is high (H), the values S'1 to S'4 taken upon rising of the frame clock from L to H is held and output. On the basis of this value, the data selection circuit 6 selects and outputs the optimal one of Q1 to Q4. In the shown embodiment, while the frame clock is H, namely during receiving of the first frame of data, Q4 is fixed and output. Therefore, dropout of data due to variation of the selected decision phase due to noise or the like during receiving of one frame, is not generated.

As set forth above, the optimal phase of clock among the multi-phase clocks PH1 to PH4 can be selected irrespective of the phase of the input data. Thus, the phase for decision of data is fixed during receiving of one frame of data.

Figure 12:
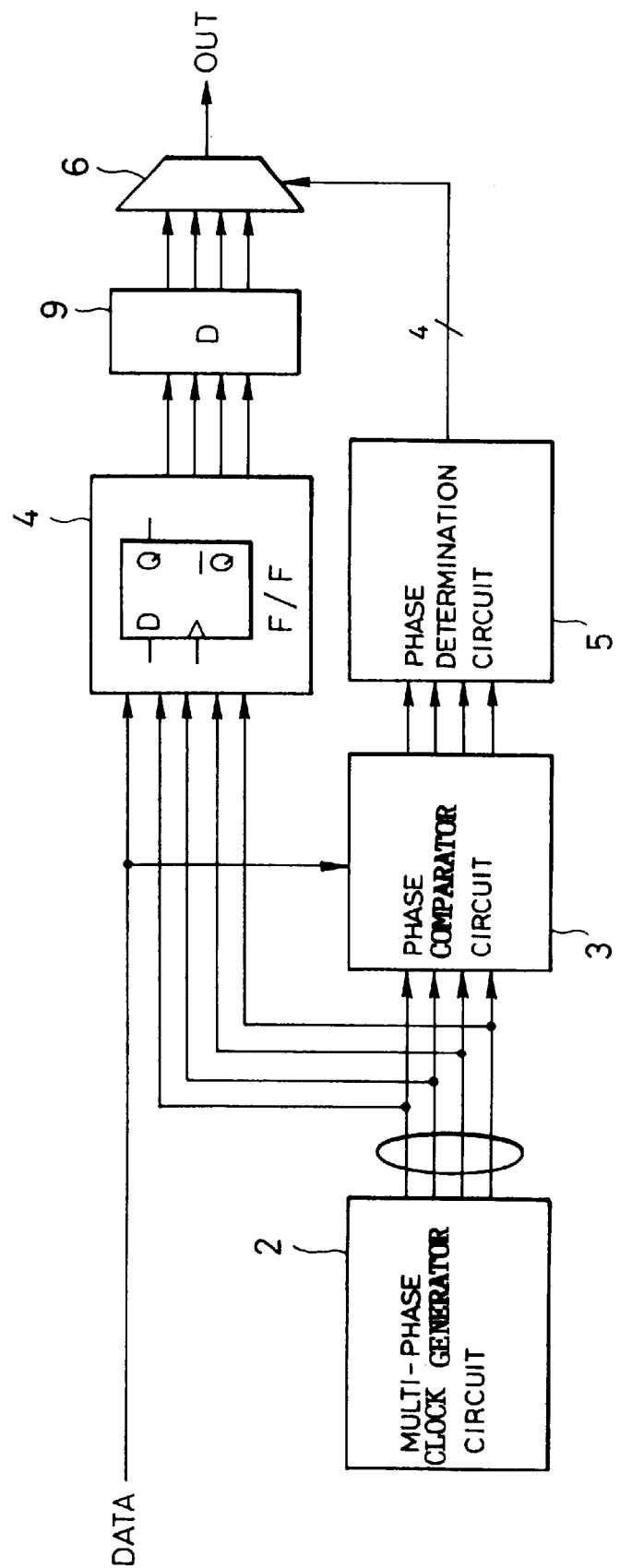
FIG. 12 a block diagram of the third embodiment of a bit synchronization circuit according to the present invention.

Next, discussion will be given for the third embodiment of the bit synchronization circuit according to the present invention with reference to FIG. 12. Even in this embodiment number of the clock phase is 4 and the data transmission speed is 10 Gb/s. It should be noted that like elements to those of FIG. 1 will be decided by like reference numerals to neglect redundant disclosure for keeping the disclosure simple enough to facilitate clear understanding of the present invention.

The bit synchronization circuit consists of to the multi-phase clock generator circuit 2, the phase comparator circuit 3, the decision circuit 4, the phase determination circuit 5, the data selector 6 and a delay circuit 9.

Figure 13:
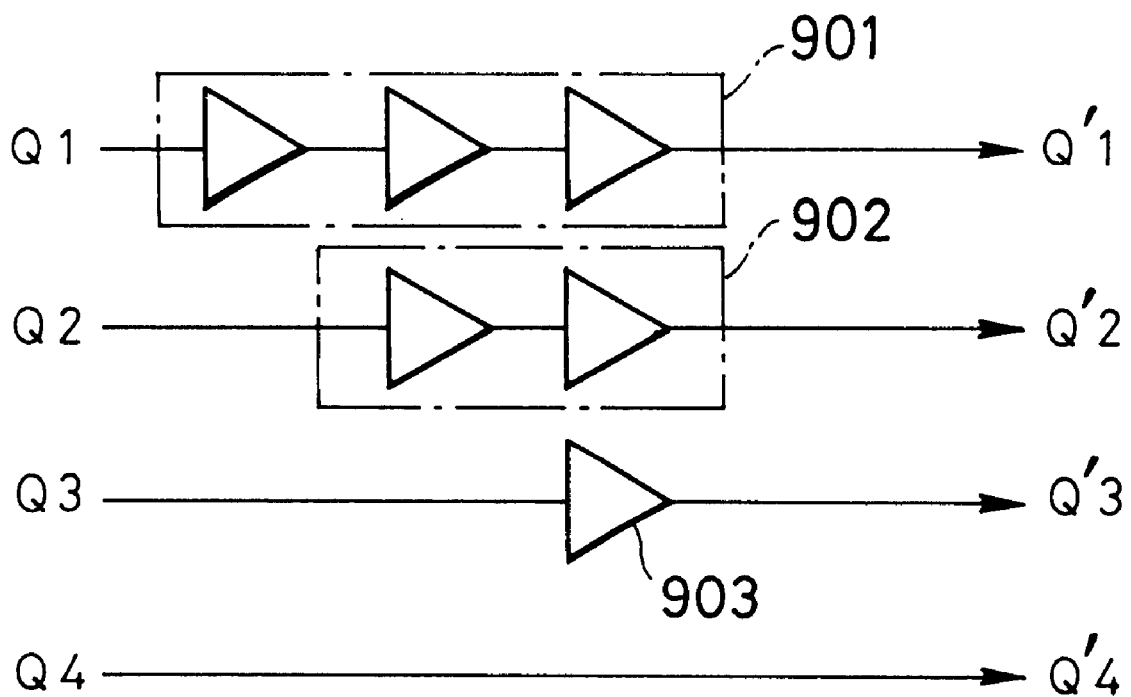
FIG. 13 is a block diagram showing a construction of a delay circuit.

As shown in FIG. 13, a delay circuit 9 is constructed with gate delays 901, 902 and 903. Respective delays of the gate delays 901, 902 and 903 are respectively 75 ps, 50 ps and 25 ps. From the timing chart of FIG. 7, the multi-phase clock PH1 is advanced the phase from PH4 at 75 ps, the multi-phase clock PH2 is advanced the phase from PH4 at 50 ps, and the multi-phase clock PH3 is advanced the phase from PH4 at 25 ps. Therefore, Q1 is advanced the phase from Q4 at 75 ps, Q2 is advanced the phase from Q4 at 50 ps, and Q3 is advanced the phase from Q4 at 25 ps.

Accordingly, by inputting the outputs Q1 to Q4 of the decision circuit 4 to the delay circuit 9, Q1 is delayed at 75 ps, Q2 is delayed at 50 ps and Q3 is delayed at 25 ps, output timings of the outputs Q'1 to Q'4 are matched with each other. Therefore, selecting any phase, the timing of the data to be output from the bit synchronization circuit becomes the same. Therefore, it becomes unnecessary to consider dropout of bit in the subsequent stage of this circuit. On the other hand, at any phase the date is input, the optimal phase among PH1 to PH4 can be selected and output.

Figure 14:
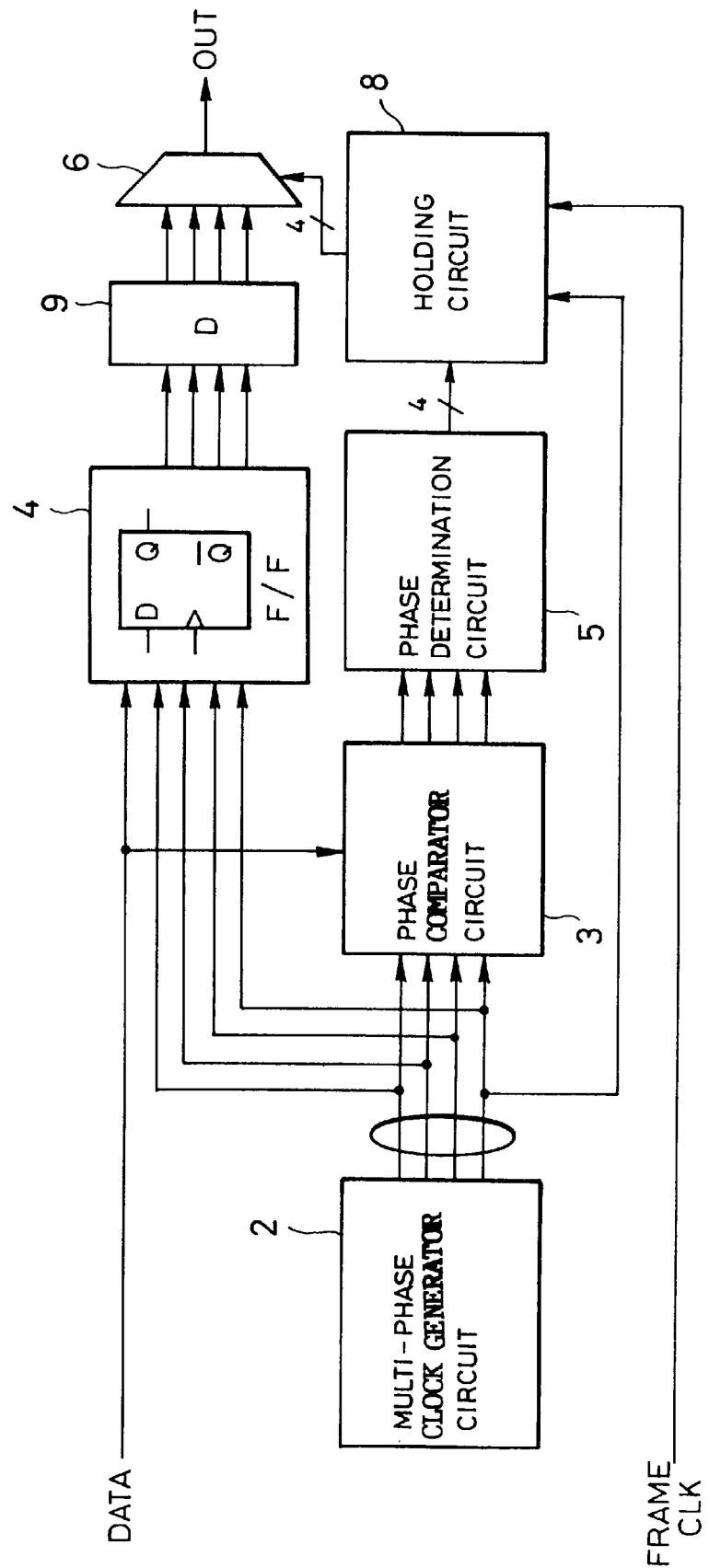
FIG. 14 a block diagram of the fourth embodiment of a bit synchronization circuit according to the present invention.

Next, the fourth embodiment of the bit synchronization circuit according to the present invention will be discussed with reference to FIG. 14. Even in the shown embodiment, number of the clock phase is 4 and the data transmission speed is 10 Gb/s. It should be noted that like elements to those of FIG. 1 will be decided by like reference numerals to neglect redundant disclosure for keeping the disclosure simple enough to facilitate clear understanding of the present invention.

Figure 15:
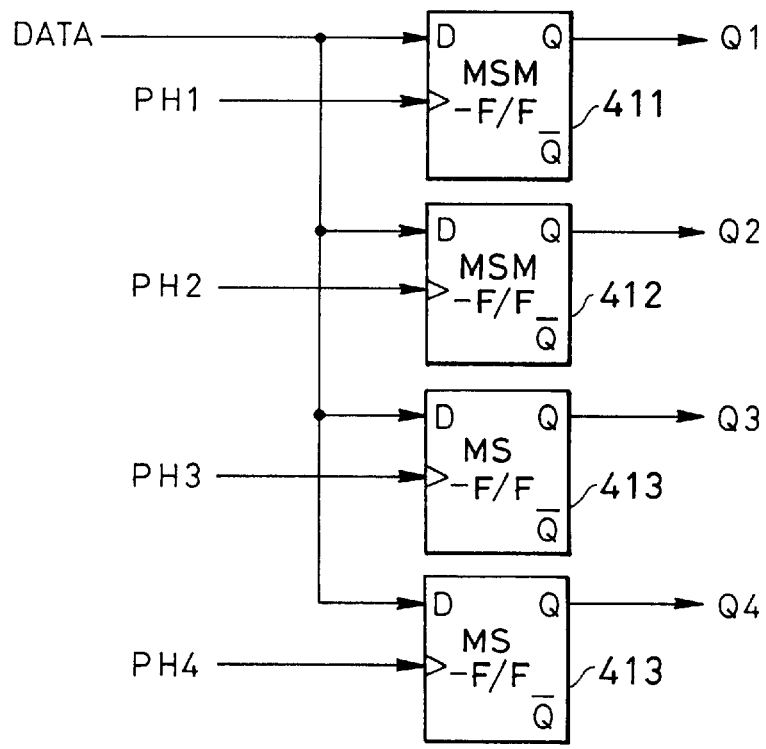
FIG. 15 is a block diagram showing a construction of an decision circuit.

The shown embodiment of the bit synchronization circuit is constructed with the multi-phase clock generator circuit 2, the phase comparator circuit 3, the decision circuit 4, the phase determination circuit 5, the data selection circuit 6, the holding circuit 8 and the data delay circuit 9. As shown in FIG. 15, the decision circuit 4 is constructed with a Master-Slave-Master (MSM) D-type F/Fs 411 and 412 with three stage latches and normal Master-Slave (MS) D-type F/Fs 413 and 414 with two stage latches.

Figure 16:
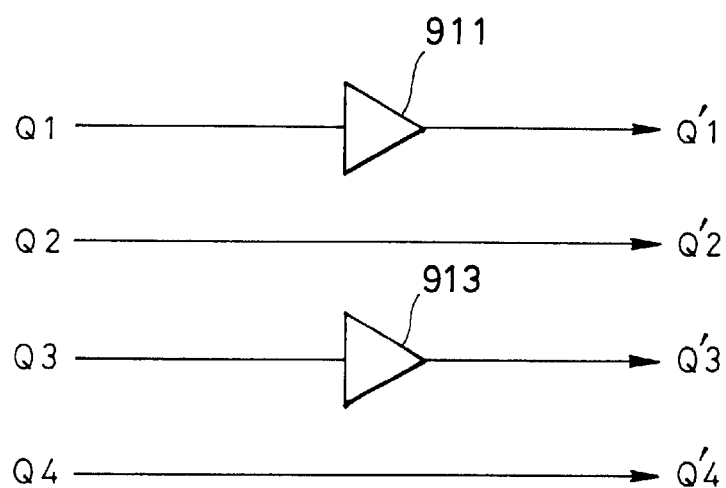
FIG. 16 is a block diagram showing a construction of a delay circuit.

As shown in FIG. 16, the data delay circuit 9 is constructed with gate delays 911 and 913 of 25 ps of delay. Referring to the timing chart shown in FIG. 7, the multi-phase clock PH1 is advanced the phase from PH4 at 75 ps, the multi-phase clock PH2 is advanced the phase from PH4 at 50 ps, and the multi-phase clock PH3 is advanced the phase from PH4 at 25 ps. However, since the decision circuit 4 is constructed with MSM F/F and MS F/F, Q1 is output at the same timing as Q3 advanced for 25 ps from Q4, and Q2 and Q4 are output at the same timing.

Accordingly, by providing delay of 25 ps for the Q1 and Q3 by the delay circuit 9, timings of all outputs of Q'1 to Q'4 can be matched. As set forth above, the operation of the fourth embodiment is essentially the same as that of the second embodiment except for the fact that the timing of outputting of data from the bit synchronization circuit is the same with selection of any phase similarly to the third embodiment. Accordingly, the optimal phase among PH1 to PH4 is selected to be fixed during receiving for one frame of data irrespective of any phase of the input data for deciding and outputting data. On the other hand, in the subsequent stage of this circuit, dropout of bit will never be caused.

In the foregoing disclosure, number of the clock phase is set to 4 but can be 3 or 8, Also, while the data speed is explained as 10 Gb/s, the data speed can be 1 Gb/s or 5 Gb/s. As set forth above, number of the phases of the clocks and data transmission speed may be selected arbitrarily and thus cannot be factor for limiting the present invention.

By employing the present invention, in the large capacity optical interconnection network employing the optical switch in the high speed region as high as Gb/s or higher, upon switching the signals from respective nodes by the optical switch, establishment of synchronization within 10 bit becomes possible with achieving jitter restricting effect. Therefore, it becomes possible to realize the bit synchronization circuit without causing degradation of receiver sensitivity due to phase deviation of data to be supplied to the phase comparator circuit and the decision circuit and phase deviation of the multi-phase clocks to permit realization of large capacity optical interconnection network.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A bit synchronization circuit comprising:
    multi-phase clock generating means for generating mutually different phases of plurality of clocks in synchronism with input reference clock;
    a plurality of decision means for respectively deciding input data using different phases output from said multi-phase clock generating means as data decision clock;
    phase comparator means for performing phase comparator between said input data and respective clocks of different phases output from said multi-phase clock generating means;
    phase determining means for determining a clock occurring level transition timing at substantially center portion of mutually adjacent level transition timings of said input data depending upon a plurality of phase comparator outputs of said phase comparator means; and
    selection means for selecting and outputting an output of said decision means taking
    the clock determined by said phase determining means as said data decision clock, phase of said input data to said phase comparator means and said decision means being the same and phases of said clocks to said phase comparator means and said decision means being the same.

2. A bit synchronization circuit as set forth in claim 1, which further comprises holding means responsive to an external command signal for holding a result of determination of said phase determining means, and said selection means is controlled according to a holding output of said holding means.

3. A bit synchronization circuit as set forth in claim 1, which further comprises delay means for making respective output timings from said decision means equal to each other.

4. A bit synchronization circuit as set forth in claim 1, wherein each of said decision means is a D-type flip-flop taking said input data as data input and said clock as clock input.

5. A bit synchronization circuit as set forth in claim 1, wherein said phase comparator means is a plurality of D-type flip-flops taking said clocks as respective data inputs and said input data as clock inputs.

6. A bit synchronization circuit as set forth in claim 1, wherein said phase determining means performs predetermined logical operation of a plurality of phase comparator outputs of said phase comparator means to determine the clock depending upon result of the logical operation.

7. A bit synchronization circuit as set forth in claim 1, wherein said phase comparator means and said decision means are arranged symmetrically with respect to an output portion of said multi-phase clock generating means and a data input portion.

8. A bit synchronization circuit as set forth in claim 2, which is used in an optical receiver in an optical interconnection network employing an optical switch.

9. A bit synchronization circuit as set forth in claim 8, wherein said external command signal is a frame signal generated from a switching control portion of said optical switch.

* * * * *